United States Patent [19]

Bushy, Jr.

[11] Patent Number: 4,896,337

[45] Date of Patent: Jan. 23, 1990

[54] ADJUSTABLE FREQUENCY SIGNAL GENERATOR SYSTEM WITH INCREMENTAL CONTROL

[75] Inventor: Edwin S. Bushy, Jr., Menlo Park, Calif.

[73] Assignee: Ampex Corporation, Redwood City, Calif.

[21] Appl. No.: 179,097

[22] Filed: Apr. 8, 1988

[51] Int. Cl.⁴ .................. H04L 25/36; H03D 3/04; G11B 5/09

[52] U.S. Cl. .......................... 375/118; 375/119; 360/51; 328/134; 328/155; 377/52

[58] Field of Search ............... 328/141, 155, 134, 72; 375/118, 119, 120; 370/108; 360/51; 377/52

[56] References Cited

U.S. PATENT DOCUMENTS

| | | | |
|---|---|---|---|
| 3,745,248 | 7/1973 | Gibson | 375/118 |
| 3,961,311 | 6/1976 | Pavoni et al. | 375/118 |
| 3,983,498 | 9/1976 | Malek | 328/134 |
| 4,280,099 | 7/1981 | Rattlingourd | 328/155 |
| 4,577,163 | 3/1986 | Culp | 328/155 |
| 4,592,078 | 5/1986 | Yamada | 377/52 |
| 4,596,026 | 6/1986 | Cease et al. | 375/118 |
| 4,680,780 | 7/1987 | Agoston et al. | 375/120 |
| 4,737,866 | 4/1988 | Ebata | 360/51 |
| 4,805,198 | 2/1989 | Stern et al. | 375/118 |
| 4,817,085 | 3/1989 | De Prycker | 370/108 |

Primary Examiner—John S. Heyman
Attorney, Agent, or Firm—Elizabeth E. Strnad; Richard P. Lange

[57] ABSTRACT

An adjustable frequency signal generator is described which utilizes a stable fixed frequency oscillator in combination with an adjustable modulus frequency divider, to obtain a frequency divided output signal whose frequency may vary within a wide range, while maintaining spectral purity of a signal generated by the stable oscillator. In the preferred embodiment the modulus of the frequency divider is controlled by an up/down counter. The frequency of the frequency divided output signal is detected with respect to a reference signal frequency. When the detected output signal frequency is higher, the counter is incremented, thereby incrementing the modulus of the divider and decreasing the frequency of the output signal. Similarly, when the detected output signal frequency is lower than the reference signal frequency, the counter is decremented, whereby the modulus of the divider decreases and the output signal frequency increases. When the detected frequency is within predetermined limits of the reference signal frequency, the modulus is maintained constant. The rate of change of the output signal frequency is independent of any signal frequencies in the system and may be selected by selecting a desired clock rate for the up/down counter.

5 Claims, 6 Drawing Sheets

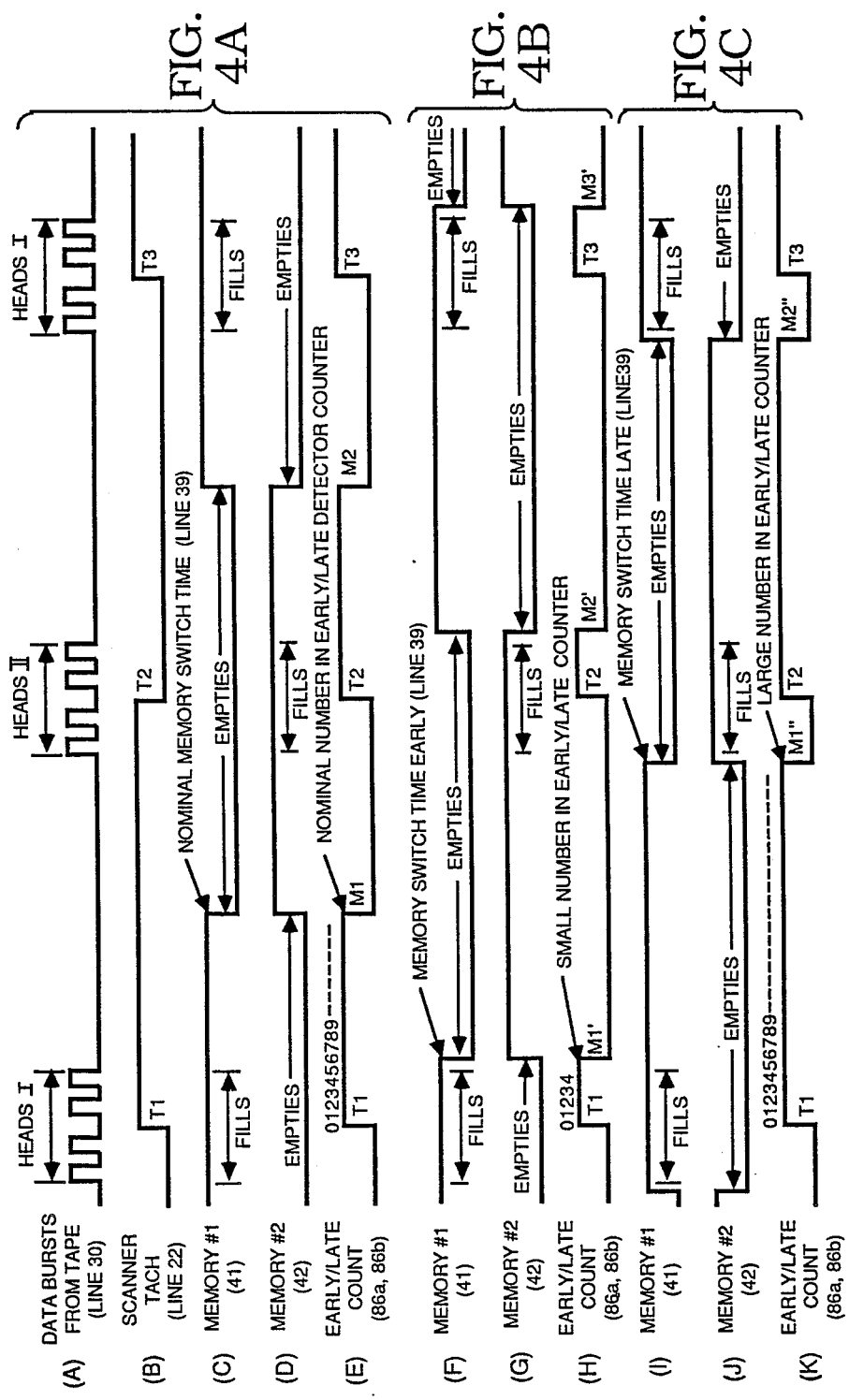

ADJUSTABLE FREQUENCY SIGNAL GENERATOR SYSTEM WITH INCREMENTAL CONTROL

This invention relates generally to an adjustable frequency signal generator system with incremental frequency control, and more particularly to such a system having a wide variable frequency range while maintaining spectral purity of a stable fixed frequency crystal oscillator.

BACKGROUND OF THE INVENTION

Voltage controlled oscillators are known to include resonant circuits comprising inductors and capacitors. While ideally these reactive elements are selected to have a high effective quality factor Q, they inherently include also some resistivity values, and therefore are susceptible to noise generation. In addition, the electrical parameters of these components are known to vary with applied voltages, temperature changes, and aging. The foregoing properties of these electrical resonators cause undesirable frequency variations of the generated signal. In applications where it is important to maintain very high spectral purity of the generated signal, it is therefore desirable to utilize oscillators which do not include elements susceptible to noise. Well known examples of such stable frequency oscillators are crystal oscillators in which the frequency of oscillation is controlled by electromechanical properties of piezoelectric crystal resonators, rather than by electrical parameters. As it is well known in the art, crystal resonators have very large values of Q, and vary very little with temperature or age. While crystal oscillators have the desired stability of the frequency of oscillations, that frequency is determined by the mechanical properties of the crystal and thus cannot be dynamically changed within a desired wide frequency range.

One example of a system where it is desirable to generate a signal having high spectral purity, while providing frequency variations within a wide range, is an audio sampling rate signal generator system, generally utilized in digital audio signal processors. When audio signals are recorded in digital form utilizing a magnetic tape recording/playback device, a sampling signal is generated to sample the audio signal, and the resulting samples are recorded. During playback the audio sampling signal is utilized to decode the data. For correct decoding of the information content the sampling signal rate must be stable and must be locked to the other clock signals utilized in the various associated playback devices. However, when the audio signal has been recorded at a certain speed of the recording medium, and it is played back at a different speed, the playback sampling signal frequency must be changed proportionally so that the played back signal can be correctly decoded.

A particular application where the playback speed is different from the recording speed occurs in video signal recording/playback devices utilizing special effects, when the signal is played back at speeds which slightly differ from the original recording speed. For example, it may be desired to reduce the playback time of commercials, or to make a particular video program to appear shorter or longer. To obtain the foregoing, the color television signal is reproduced utilizing time base correctors with automatic scan tracking, which produces slow motion pictures by reproducing the same picture more than once, or fast motion by periodically deleting pictures, in a well known manner. However, while the foregoing techniques are practical for processing video signals, they are not applicable for reproduction of audio signals accompanying the picture information. In case the audio signal is played back at a medium speed which differs from the medium speed during recording, its original frequency is distorted, and an unpleasant audible distortion results. Therefore, when the video signal is played back utilizing special effects, it is customary to pass the accompanying off-tape audio signal through an external device which returns it to its normal frequency and intonation.

Audio signals which are recorded digitally by high quality recording/reproducing systems, such as for broadcast applications, are known to utilize a predetermined audio sampling rate for each channel. During special effects provided for the accompanying video signal that sampling rate must be increased or decreased to conform to the change in playback speed with respect to the original recording speed. The performance of these high quality digital audio systems depends in large part on the spectral purity of the sampling signal, that is on the stability of the sampling signal rate.

SUMMARY OF THE INVENTION

Accordingly, the present invention provides an adjustable frequency signal generator system which utilizes a stable fixed frequency oscillator, preferably implemented by a crystal oscillator, and a circuit which varies the frequency of the signal generated by the oscillator within a desired frequency range, without impairing the spectral purity of the generated signal. To obtain the foregoing, the circuit of the invention utilizes an adjustable modulus frequency divider, which divides the frequency of the signal from the oscillator to obtain a selected dividing ratio, and it varies that modulus in response to a control signal. The frequency of the output signal from the divider is detected with respect to a reference signal frequency. A first control signal is provided when the detected frequency is higher than a predetermined multiple of the reference signal frequency. A second control signal is provided when the detected frequency is lower than the predetermined multiple of the reference signal frequency. A modulus control circuit receives the first and second control signal and it adjusts the modulus of the frequency divider in such a way that the measured signal frequency will correspond to the predetermined multiple of the reference signal frequency.

In the preferred embodiment an early/late detector detects occurrence of a signal derived from the output signal provided by the frequency divider, with respect to a reference signal, and indicates whether that derived signal has occurred early or late with respect to a reference signal. The modulus of the divider is incremented or decremented to change the output signal frequency such a way that the derived signal will coincide with the reference signal.

In the preferred embodiment the adjustable frequency signal generator of the invention is utilized to selectively increase or decrease the audio sampling rate in a digital video tape recording/reproducing device utilizing special effects. As it is known in the art of rotating head digital video tape recording and playback, the digital audio signal samples are compressed into high density data packets and recorded on the tape at a video signal rate, which is much higher than the audio sampling rate. These packets are recorded within a predetermined location along each video head pass across the tape. Consequently, these packets of samples are recovered during a very short burst of time, by the playback video head. The recovered off-tape samples are written in a memory at a high input clock rate, and stored. The stored samples are then read from the memory as a continuous output data stream at a steady low output clock rate, corresponding to the desired audio sampling rate, as it is necessary for further processing of the audio data. When the input clock rate on the average is the same as the output clock rate, there will be no problem associated with loss of data due to underflow or overflow of the memory.

While one or more memories may be utilized for storing the high speed input data, the preferred embodiment of the invention uses two separate memories for the audio data played back by two groups of rotating video heads, which are displaced from each-other by 180 degrees along the periphery of the rotating scanner drum, as it is well known in the art of video recording and playback. While data from the tape is being stored in a first memory, also referred to as input memory, as data bursts or packets at a high speed, previously stored data is being extracted from a second memory, also referred to as output memory, at a steady low speed for further use. During normal playback operation the input data rate and the output data rate on the average are the same. Thus ideally by the time when the first memory is filled to capacity by the off-tape input data, the second memory should become empty and ready to receive a new packet of off-tape data. At that particular time switching between the respective operations of the first and second memory takes place, and thereafter the second memory receives the off-tape high speed data while the data from the first memory is being outputted at a low speed. A memory switching signal is known to control the time of switching between the two memories. Under normal conditions the memory switching signal occurs about midway between two consecutive reference signals, which are for example derived from the scanner tachometer signal. However, in case when the average rate at which the audio samples are recovered from the tape is slightly greater than the nominal sampling rate, for example due to special effects used in video, the input data bursts will arrive progressively earlier with respect to memory switch time, and after a number of consecutive memory cycles memory switching may occur during the receipt of input data by the input memory. Consequently, loss of data will occur.

On the other hand when the average rate of receiving the audio samples from tape is slightly slower than the nominal sampling rate, the input data bursts will arrive progressively later with respect to the memory switch time, and again, memory switching may occur during the reception of input data. In both cases the memory switching signal will no longer have a fixed time relationship with the tachometer control signal, but will be progressively advanced or retarded with respect thereto. To prevent data from being lost due to the foregoing undesirable operating conditions, it is necessary to increase or decrease the audio sampling frequency utilized for decoding the playback data with respect to the scanner tachometer signal frequency. In the preferred embodiment the occurrence of the memory switching signal with respect to the tachometer reference signal is detected by the previously mentioned early/late detector, and the resulting control signals are applied to a modulus control circuit. That circuit in turn increments or decrements the modulus N of an adjustable modulus frequency divider. In accordance with the preferred embodiment of the invention the audio sampling rate is changed by decrementing or incrementing that modulus to increase or decrease the rate at which the memories are emptied, to prevent loss of data. The modulus control circuit is preferably implemented by an up/down counter which in response to the early/late control signals counts up or down depending on the polarity of that control signal. The count provided by the up/down counter in turn effectively changes the modulus of the frequency divider.

Another embodiment of the invention utilizes a first-in, first-out (FIFO) type of memory having a so-called "dipstick circuit". The FIFO memory receives input data at a high frequency, and simultaneously outputs the stored data at a low frequency, as a continuous data stream. The dipstick circuit detects the amount of data present in the memory as a measure of the average output data frequency with respect to the average input data frequency. When on the average the frequency of the input data is equal to the output data frequency, loss of data will not occur. However, when on the average the input data frequency is slightly higher or lower than the output data frequency, memory overflow or underflow will occur, accompanied by loss of data. In the above cases the dipstick circuit will output a control signal indicating that the memory is almost full, or almost empty. These signals are applied to a modulus control circuit which increments or decrements the modulus of the frequency divider, thereby decreasing or increasing the output signal frequency therefrom.

It is a particular advantage of the invention that the output signal of the adjustable frequency signal generator, for example the audio sampling signal, is generated by a stable fixed frequency oscillator, such as a crystal oscillator, while the audio sampling rate may be changed within a desired frequency range to accommodate changes in the off-tape data rate. A resulting desired high degree of spectral purity of the generated signal is thereby obtained, while the frequency of that signal may be changed within a wide frequency range.

It is a further advantage of the invention that the rate of the output signal frequency change may be selected independently from the fixed frequency of the stable oscillator, or from the frequency of the reference signal, or from any other signal frequency in the circuit. In the preferred embodiment this is accomplished by applying an arbitrary clock signal to the up/down counter at a frequency which is selected to obtain a desired rate of change of the modulus of the frequency divider.

BRIEF DESCRIPTION OF THE DRAWINGS

FIGS. 4A to 4C are timing diagrams depicting operation of the preferred embodiment shown in FIG. 3.

DETAILED DESCRIPTION

Figure 1:
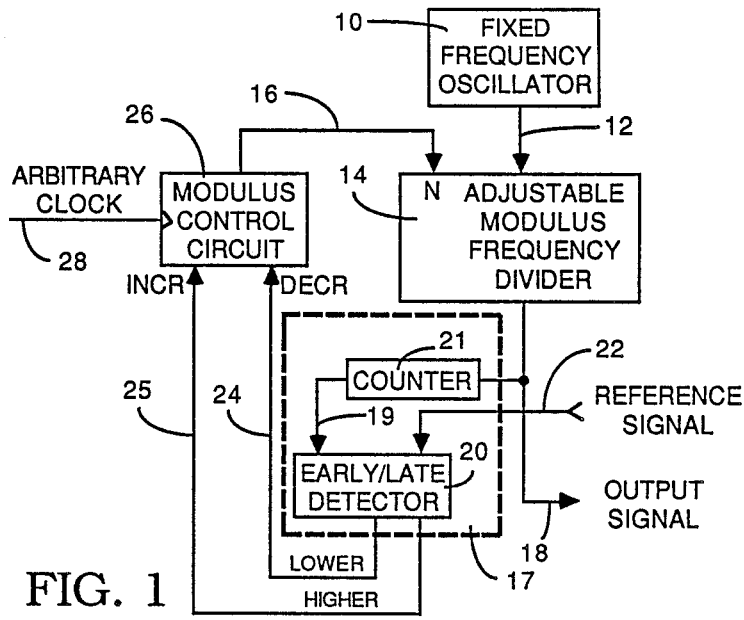
FIG. 1 is a simplified block diagram showing a basic configuration of one embodiment of the adjustable frequency signal generator system of the invention.

It is noted that like reference numerals will be utilized to designate like circuit elements throughout the description and in all the drawing figures to facilitate comparison.

With further reference to FIG. 1, a fixed frequency crystal oscillator 10 oscillates at a stable constant frequency, for example 18 MHz. The output signal from the oscillator is applied on line 12 to a frequency divider 14 which has an adjustable modulus N. The modulus is selected to obtain a frequency divided output signal on line 18, having a low nominal frequency, for example in the order of tens of kHz. That nominal frequency may be varied by varying the modulus N via line 16, as it will follow from further description. A frequency detector 17, for example comprising an early/late event detector 20, and a counter 21, receives at one input the frequency divided signal on line 18, and at its other input an external signal having a reference frequency. As an example, the frequency divided signal on line 18 may represent a playback audio sampling signal, having a nominal frequency of 48 kHz, which is utilized to decode audio samples played back from a magnetic tape, as it has been previously described. In this example, as the external reference signal, a tachometer signal may be utilized, which is derived from the rotation of the scanner drum during playback. The counter 21 counts a predetermined number of cycles of the output signal on line 18, corresponding to one cycle of the tachometer reference signal on line 22.

During normal playback operation, that is when the tape speed is the same as it was during recording, the frequency of the output signal on line 19 from the counter 21 will remain a known predetermined multiple of the tachometer signal frequency. The early/late event detector 20 detects a difference between the occurrences of the respective signals on line 19 and 22. Ideally these two signals will be concurrent and thus no difference will be detected. If however the detector 20 detects an early or late arrival of the signal on line 19 with respect to the reference signal on line 20, that is, when the signal on line 18 has a higher or lower frequency with respect to a predetermined multiple of the reference signal frequency on line 22, the detector 20 applies a control signal on one of the lines 24, 25 to a modulus control circuit 26. In response to that control signal the circuit 26 increments or decrements the modulus N of the frequency divider 14, thereby decreasing or increasing the frequency of the output signal on line 18. The foregoing operation will be repeated until the detector 20 detects substantial coincidence of its two input signals, in which case the control signals on lines 24, 25 will not be applied, and the modulus N will remain constant.

It is seen from the foregoing description that while the output signal frequency on line 18 may be varied within a relatively wide range of frequencies by changing the modulus of the frequency divider 14, that signal is in fact generated by the crystal oscillator 10, and consequently it has a desired high spectral purity. Further advantages of the invention will become more apparent from the detailed description with reference to the further embodiments of the present invention.

Figure 2:
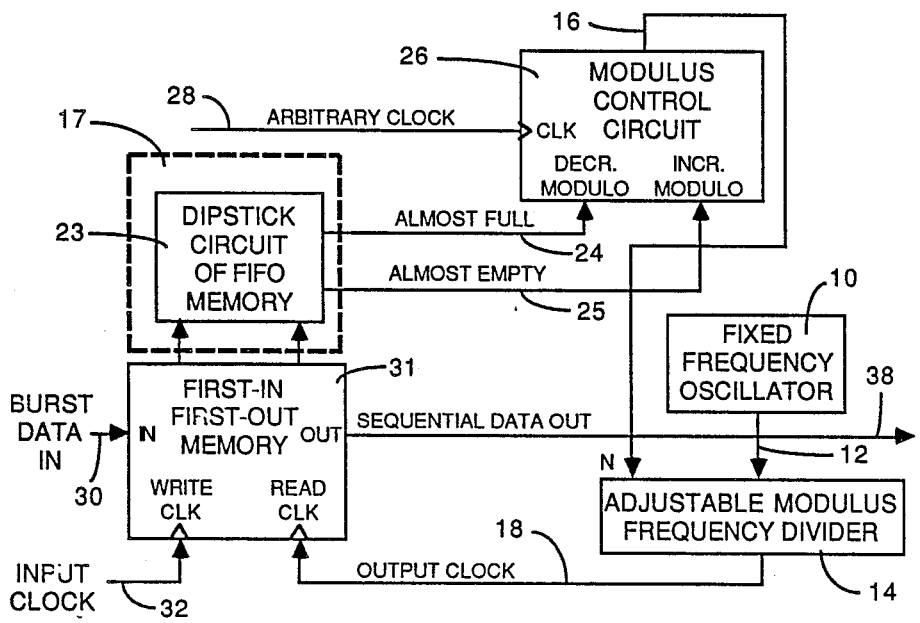
FIG. 2 is a simplified block diagram of another embodiment of the invention, where the adjustable frequency signal generator system controls data flow through a FIFO memory.

FIG. 2 shows an embodiment where input data, for example in the form of high frequency serial data words are received on line 30 and written into a memory 31, for example implemented as a well known first-in, first-out type of memory, further referred to as FIFO memory. The data words are written into the memory 31 in the form of high density bursts or packets of data, at a relatively high frequency, for example 8.1 MHz, synchronously with an externally applied input or write clock signal received on line 32. The data from memory 31 is extracted at a steady, relatively low nominal output or read clock rate, for example 48 kHz. In accordance with this embodiment of the invention, the output clock signal on line 18 corresponds to the previously described frequency divided signal from the adjustable modulus frequency divider 14. It will be understood by those skilled in the art that, under normal operating conditions the input and output clock signal frequencies are selected such that the average number of data words written into the memory 31 and read therefrom is equal over a known period of time. Otherwise the memory would run out of data storage space, or become empty in the course of operation, both situations resulting in loss of data. Ideally, under normal operating conditions there is no change in the frequency of the input clock signal on line 32, and the division ratio of the adjustable frequency divider 14 will remain constant. When, for example, the circuit of FIG. 2 is utilized for recovering audio signal samples from a video tape, and the frequency of the crystal oscillator is selected 18 MHz, the modulus of the frequency divider will be maintained constant at N=375, thereby maintaining a desired constant nominal audio sample clock frequency of 48 kHz on line 18.

The FIFO memory 31 utilized in the circuit of FIG. 2 is associated with a conventional so called "memory dipstick" circuit 23. As it is well known in the art, the memory dipstick circuit keeps track of the number of data read from the memory 31, with reference to the number of data which has been written therein, and thus it detects when the memory becomes almost full or almost empty. When the frequency of the input data on the average becomes higher than the frequency of the output data, the memory 31 will gradually be filled to capacity and start to overflow. However, such condition is prevented by applying an "almost full" signal from the memory dipstick circuit 23 on line 24 to the modulus control circuit 26. Circuit 26 then responsively decrements the modulus N of the frequency divider, in turn resulting in increasing the output signal frequency on line 18 from the frequency divider 14. As a result, the read clock frequency applied to the FIFO memory 31 is increased, and no overflow will occur. Similarly, when on the average the output data rate is higher than the input data rate, the memory 31 would gradually become empty. To prevent such situation, the circuit 23 applies an "almost empty" control signal on line 25 to the modulus control circuit 26, which in response thereto increments the modulus N. As a result, the frequency of the signal on line 18, which is applied as the read clock to the FIFO memory 31 decreases, thereby decreasing the rate of the output data flow from the memory. It is seen from the foregoing description that in the particular embodiment of FIG. 2 the almost full and almost empty control signals correspond to the previously described early/late detection control signals on lines 24, 25 provided by the detector 20 of FIG. 1. When comparing the embodiment of FIG. 2 to the embodiment of FIG. 1, it is seen that memory dipstick circuit 23 corresponds to the previously described frequency detector circuit 17 of FIG. 1. However, in this example the input clock signal may be considered as being the reference signal, providing the reference frequency for the frequency detection. It is derived from the scanner tachometer signal, and thus its frequency is directly related thereto. During normal operating conditions the average output clock frequency is equal to the average input clock frequency over a number of consecutive memory cycles.

The rate of incrementing or decrementing the modulus control circuit 26 may be selected independently of any other signal frequency utilized in the circuit as follows. Preferably circuit 26 is implemented as an up-/down counter, which counts up in response to a previously described control signal on line 25, and counts down when a control signal on line 24 is applied thereto. The frequency of counting is determined by an externally applied clock signal on line 28, which may be selected as having an arbitrary frequency, independent from any other signal utilized in the circuit.

Now the preferred embodiment of the invention will be described with reference to FIG. 3. Input data is received on line 30 at a high rate and applied via switch 33 to one of the memories 41, 42, depending on the position of the switch 33. In this particular example the input data is received as data bursts in the form of high density data packets, representing audio signal samples reproduced from a magnetic rape by a rotating video head. These reproduced samples are written for example into memory 42 at the high rate, for example 8.1 MHz, as determined by the externally applied input clock signal on line 32, provided by an external clock signal generator (not shown), in synchronism with the off-tape data rate, in a known manner. The input clock signal on line 32 is applied to an input address counter 34, which generates input memory addresses at the input clock rate. The input clock signal and the input addresses are applied from the address counter 34 via switch 33 to the memory 42, presently serving as input memory. Consequently, the input data on line 30 is written into the input memory 42 at an address determined by the address counter 34, and a rate determined by the input clock signal on line 32. While the input data is written into memory 42, as it is shown by the position of switch 33 in FIG. 3, data which has been previously written into memory 41 is being outputted therefrom via switch 33 and line 38, at a low output clock rate, for example 48 kHz, as it is necessary for further processing of the reproduced audio samples. The previously described output signal on line 18 from the adjustable modulus frequency divider 14, is applied as a clock to an output address counter 35. The counter 35 generates output memory addresses from which the output data is read. The counter 35 applies the output addresses and an output clock signal, derived from the signal on line 18, to the output memory 41 via line 47 and the memory switch 33, during the time when memory 42 receives the input data on line 30, as it will follow from further description.

In the preferred embodiment memories 41, 42 are identical and thus have the same capacity. The input address counter 34 is reset any time after the receipt of a data packet, and prior to the arrival of a new data packet. In FIG. 3 the counter 34 is reset by the terminal count on line 48 from the output address counter 35. The output address counter 35 is coupled to count the number of output or read clocks applied to the output memory, which number corresponds to the number of data in each packet. In the preferred embodiment that number corresponds to the number of audio samples contained obtained from one playback head pass over the tape. When the terminal count is obtained, the counter 35 applies a signal in the form of a narrow pulse to a divider by two 49, which in turn applies a memory switch control signal on line 39 to change the position of the memory switch 33. The terminal count also resets the counter 35 which then starts to count output memory addresses from the beginning. By changing the position of switch 33, the respective operations of the input and output memories are interchanged, and memory 41 becomes the input memory, while memory 42 becomes the output memory. As a result, the input data on line 30 and the input addresses and input clock on line 46 are now applied to input memory 41, while the output addresses and output clock on line 47 are applied to output memory 42, and the output data on line 38 is applied from output memory 42. When all the data have been read from the output memory 42, the output address counter 35 provides a terminal count, which in turn causes the switch 33 to change its position again, and the above described memory cycle will repeat with memory 42 being the input memory and memory 41 the output memory.

As it will be described in greater detail with reference to FIGS. 5A to 5C, the early/late detector 20 preferably comprises a counter 86a, 86b, which counts the number of clock cycles at the output clock frequency, which is derived from the signal on line 18, beginning with each scanner tachometer reference signal on line 22, until the occurrence of the memory switch signal on line 39. When during normal playback operation the input data rate on line 30 substantially corresponds to the frequency at which the data has been originally recorded, the number of input data on line 30 on the average will be equal to the number of output data on line 38, and thus the memories 41, 42 will not overflow or underflow.

Figure 3:
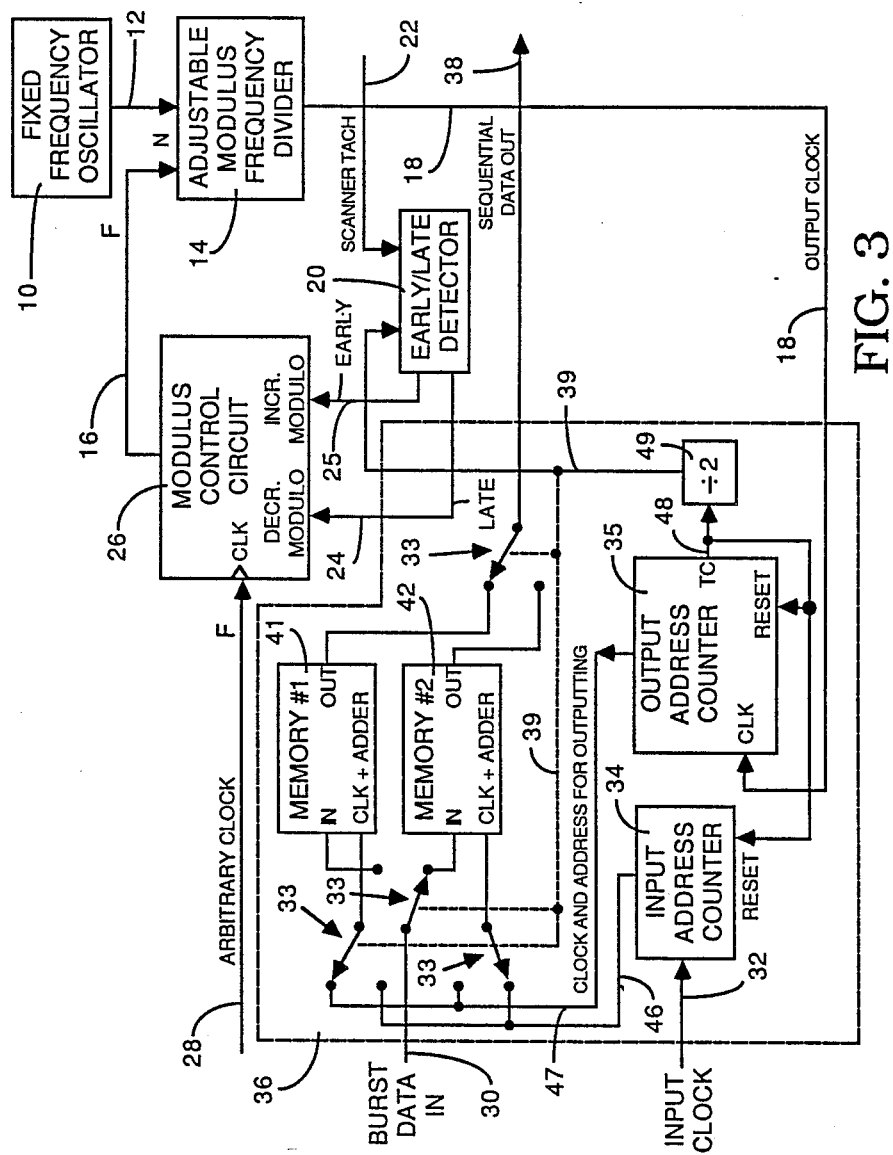
FIG. 3 is a simplified block diagram of the preferred embodiment of the invention, where the adjustable frequency signal generator system controls data flow through switched memories.

FIGS. 4A to 4C show timing diagrams (A) to (K) depicting various situations which may occur during the operation of the circuit of FIG. 3. With further reference to FIG. 4A, diagram (A) shows consecutive data bursts recovered from tape by two groups of playback heads, group I and II, displaced from each-other by 180 degrees around the circumference of a rotating scanner drum (not shown), as it is well known in the art. That recovered data is received as the input data on line 30, as it has been previously described. Diagram (B) depicts the scanner tachometer signal, which in this example has transitions T1 to Tn coinciding with the middle of each burst of data At (C) there is shown a timing diagram corresponding to filling and emptying one of the two memories, for example input memory 41 during normal operation, that is when the average rate of input and output data is the same over a long period of time. As it is seen from diagram (C), the time necessary for filling the memory substantially coincides with the time of receiving data on line 30. After memory 41 is filled with the high speed input data during a relatively short period of time, it waits until all the data which has been previously stored in the output memory 42 is outputted therefrom, as it is shown at (D), at which time the memory switch signal on line 39 occurs. During normal operation depicted in FIG. 4A, the memory switching time occurs approximately in the middle between two consecutive transitions T1, T2, and T2, T3, of the tachometer signal shown at (B).

The early/late detector 20 comprises a counter 86a, 86b, shown in the detailed circuit diagram of FIG. 5A, which Figure will be described later. That counter counts the number of output clock pulses applied on line 18a, derived from the previously described signal on line 18. As it is shown at (E) in FIG. 4A, that counter 86a, 86b starts to count at each tachometer signal transition T1 to Tn, and the resulting count is detected at each memory switching time M1 to Mn by a programmable read only memory (PROM) 90, shown in FIG. 5A. The early/late detector 20 compares the detected count with a nominal count, corresponding to normal operation, and decides, whether the memory switching signal arrived on time, too early, or too late with respect to the tachometer reference signal. It is seen from FIG. 4A that during normal operation the counter 86a, 86b provides a nominal count, as shown at M1 to Mn, that occurs after all the input data has been written into the input memory, and after all output data has been read from the output memory. Consequently during normal operation data loss will not occur.

FIG. 4B shows a situation where on the average there is a decrease in the input data rate on line 30 with respect to the normal data rate. As a result, the memory switch times M1' to Mn' will occur progressively earlier during consecutive memory cycles, approaching the time when the input memory 41 just becomes filled with input data, as it is shown ar (F). In this case, if no correction is provided, in time the memory switch signal may occur before the input memory is filled, and input data will be lost. At the same time the counter 86a, 87a, will provide a progressively decreasing count at the tachometer signal time T1 to Tn, as it is illustrated at (H) showing at the memory switching times M1' to Mn' a substantially smaller count than during normal operation. In this case the event detector 20 detects an early occurrence of the memory switch signal on line 39 with respect to the tachometer signal on line 22, and it provides responsively a control signal on line 25. That control signal in turn causes the up/down counter 26 to increment the modulus N of the frequency divider 14. As a result, the frequency of the output signal on line 18 decreases. As it has been previously described, in the embodiment of FIG. 3 a clock signal on line 47, derived from the signal on line 18, is applied to the output memory 41 or 42 as the read clock signal. By progressively decreasing the frequency of the read clock signal it will take longer to empty the output memory and consequently, the memory switch time will occur progressively later with respect to the tachometer signal, until the event detector 20 will detect a normal playback situation as it has been described with reference to FIG. 4A. In that case the event detector 20 inhibits the up/down counter 26 and the modulus N will remain unchanged until the next early/late control signal is applied from detector 20.

The timing diagrams in FIG. 4C depict a situation when the memory switching signals M1" to Mn" arrive too late with respect to the tachometer reference signal shown at (B) in FIG. 4A. The memory switching signals are shown as arriving just before the new input data is applied to the input memory 42, while a substantially larger than nominal count is accumulated in the counter 86a, 86b of FIG. 5A, as shown at (K). It is seen from these timing diagrams that in case the situation remains uncorrected, the memory switching signal may occur during the receipt of an input data packet by the input memory, in which case loss of data results. To correct this situation, the early/late event detector 20 compares at memory switch time the count provided by the counter 86a, 87b with the nominal count, and detects a late arrival of the memory switch signal. Consequently, the detector 20 applies a control signal on line 24 to decrement the up/down counter 26, which in turn causes to decrement the modulus N of the frequency divider 14. As a result, the output signal frequency on line 18 increases, causing in turn to increase the read clock rate on line 47 which determines the rate of outputting the data from the output memory 41 or 42. As a result, the time of outputting all the data from the output memory will be shortened, and the memory switching times M1" to Mn" will progressively occur earlier, until the early/late detector 20 will once again detect normal operation. When that situation occurs, the detector 20 inhibits the up/down counter 26 and thus the modulus N will be maintained at a constant value until the next deviation from normal operation is detected by detector 20, and when either operation as described with reference to FIG. 4B or 4C will be repeated.

It follows from the foregoing description that the circuit in accordance with the preferred embodiment of the invention prevents loss of data by preventing any of the two memories from starting to fill with new input data before all the previously stored data has been removed therefrom. At the same time it is prevented to output data from any of the two memories before all the new input data has been stored therein. The foregoing is obtained by increasing or decreasing the frequency of the frequency divided output signal with respect to the tachometer reference signal, until both signals maintain a predetermined frequency relationship. It is a particular advantage of the preferred embodiment of the invention that while the foregoing changes in the output signal frequency may be provided within a desired relatively wide frequency range, the spectral stability of the output signal remains very high due to the use of a stable fixed frequency crystal oscillator which generates that signal.

It is seen from the foregoing description that during normal operation, when the difference between the respective occurrences of the reference signal on line 22 and the memory switching signal on line 39 is within limits which are considered to be within normal operation by the early/late detector 20, the up/down counter 26 is inhibited and the modulus N remains fixed. When the time difference is outside that limit, the modulus will incrementally change between two extreme values. The minimum rate of that change is dependent on the size of the memory, and in the preferred embodiment it is about one second, which is a sub-audible rate. Generally, for an independent arbitrary clock frequency F on line 28, the rate of change of the divided output signal frequency on line 18 is $F/N$ cycles/sec$^2$, where N is the adjustable modulus of the frequency divider 14.

Figure 5A:
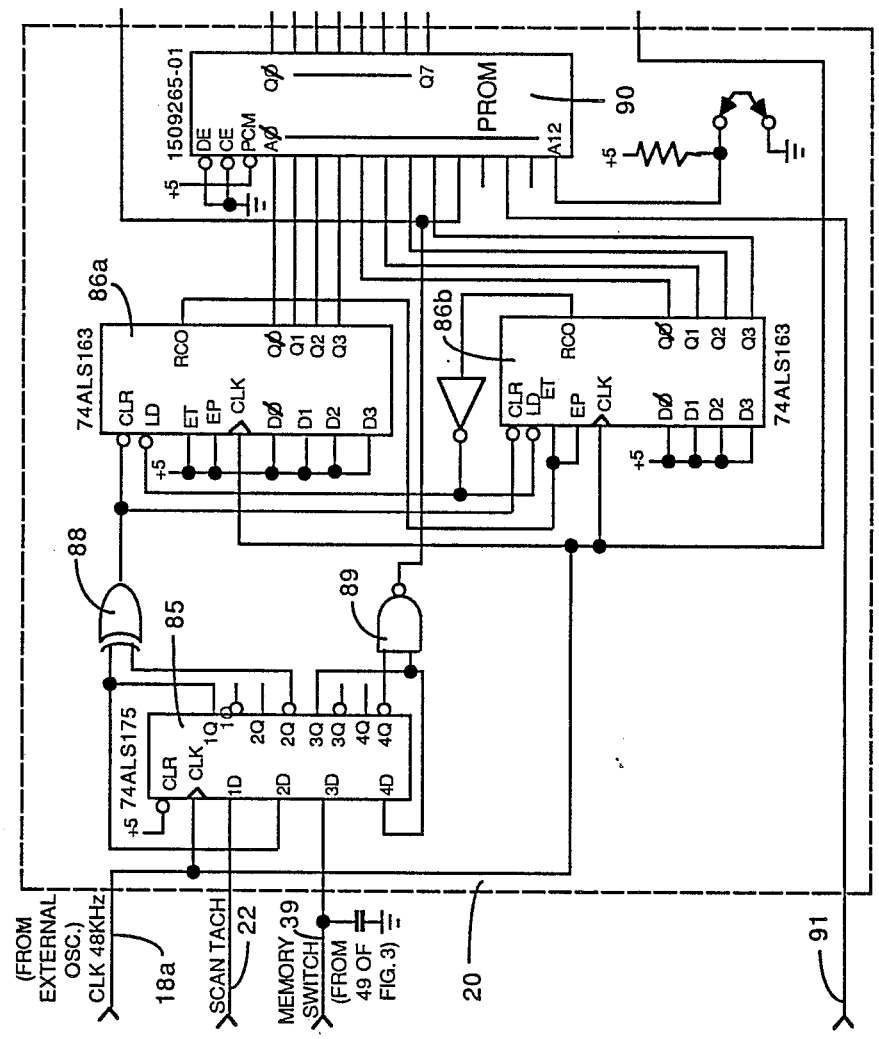
FIGS. 5A to 5C are consecutive portions of a detailed circuit diagram corresponding to a portion of the block diagram of FIG. 3.
Figure 5B:
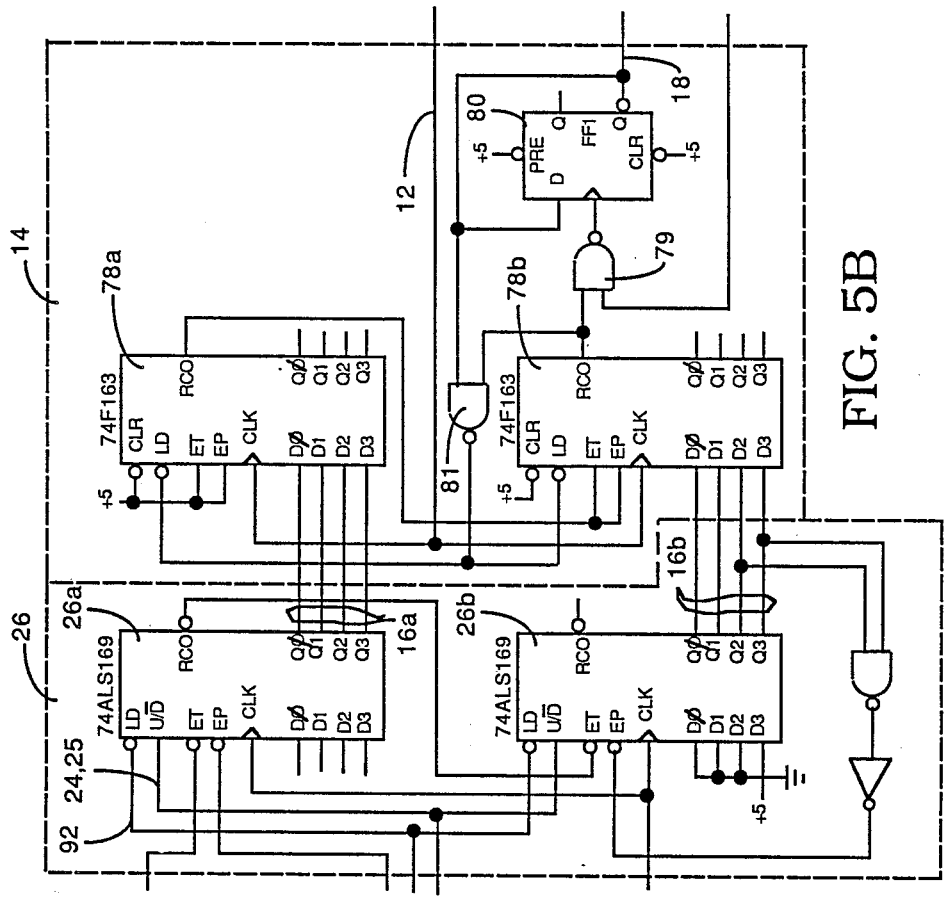
Figure 5C:
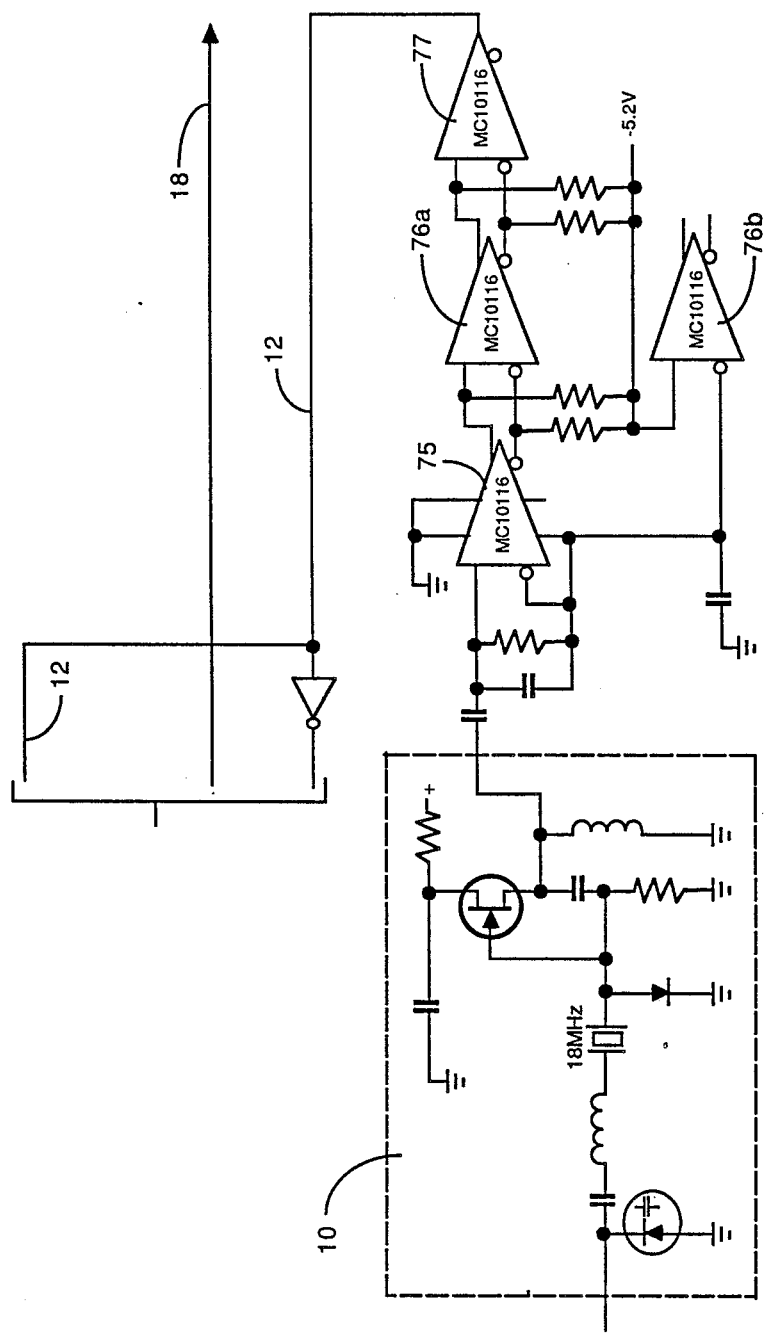

A more detailed description of the preferred embodiment of the invention will be now provided with reference to the detailed schematic circuit diagram shown in FIGS. 5A to 5C. The detailed circuit diagram corresponds to a portion of the above described block diagram of FIG. 3. With further reference to FIG. 5C, it shows a conventional stable crystal oscillator 10, followed by conventional amplifier clipping stages 75, 76a, 76b, which are followed by an ECL to TTL logic level converter 77. A resulting rectangular waveform output signal from the converter 77 is applied via line 12 as a clock signal to an adjustable modulus frequency divider circuit 14, shown in FIG. 5B. Circuit 14 comprises adjustable modulus counters 78a, 78b, a flip-flop 80, and NAND gates 79 and 81. As an example, in the preferred embodiment the frequency of the clock signal on line 12 is 18 MHz. During normal operation that frequency is divided by the circuit 14 by a constant modulus N equal to 375, whereby an output signal frequency on line 18 equal to 48 kHz is obtained.

The early/late detector 20 of FIG. 3 is implemented in FIG. 5A as follows. A 4-bit D-flip-flop 85 receives the previously described scanner tach signal on line 22 at one input, and the previously described memory switch signal on line 39 from the frequency divider by two 49 of FIG. 3 at another input. The flip-flop 85 also receives a nominal 48 kHz clock signal on line 18a which is derived from the previously described signal on line 18 and synchronous therewith. The early/late detector 20 further comprises counters 86a, 87b, which together represent an 8-bit counter for measuring the time between the occurrences of each tachometer reference signal on line 22 and a following memory switching signal, as follows. In normal operation there is a fixed time relationship between the edges of these two consecutive signals, as it is represented by the time intervals T1 to M1, and T2 to M2 shown in FIG. 4A. Both the rising and falling edges of the scanner tach signal are shaped into a low going pulse by an EXOR gate 88, which pulse clears the counters 86a, 86b, and thereafter these counters begin to count. At the occurrence of the memory switch signal on line 39 a NAND gate 89 forms a low going pulse of one clock duration, which enters a PROM 90. In response to that pulse PROM 90 checks the contents of counters 86a, 87b, and compares that count with a nominal count obtained during normal operation, as it has been previously described with reference to FIG. 3.

When the PROM 90 determines that the thusly obtained count corresponds to normal operation, it inhibits an up/down counter 26a, 26b, via line 24, 25 from incrementing or decrementing the count provided thereby. The count from counter 26a, 26b is loaded via lines 16a, 16b to preset the previously described counter 78a, 78b of the frequency divider circuit 14, thereby presetting the modulus N. As it has been previously described, in the preferred embodiment the frequency divider circuit 14 divides by a constant modulus of 375 during normal operation. However, that modulus is changed depending on an early or late arrival of the memory switching time with respect to the tachometer reference signal, as it has been described with reference to the timing diagrams of FIGS. 4A to 4C.

During a playback speed which is different from the normal speed, the memory switching time on line 39 will occur earlier or later with respect to the tachometer reference signal on line 22 than during normal speed. Thus when it is indicated on a control line 91 that a special operating mode has been selected by an operator, such as slow motion or fast motion playback, the memory switch pulse from gate 89 enables the up/down counter to count in the direction determined by a direction line 24, 25. In this mode of operation the counter 26a, 26b is not loaded via line 92 from PROM 90. Thus in a special mode of operation indicated by control line 91, the counter 26a, 26b is controlled by the PROM to increment or decrement, and to thereby change the preload to the variable modulus counters 78a, 78b so as to vary the division ratio provided thereby.

It is seen from the foregoing description that the division ratio can be varied to provide a wide range of operating frequencies. At the same time the output signal is generated by a stable, fixed frequency crystal oscillator, and thus, it has a desired high spectral purity.

Although the invention has been described in terms of the various embodiments detailed herein, those skilled in the art will appreciate other embodiments which will accomplish the same results substantially in the same manner. All such embodiments are intended to be within the scope of the claims appended thereto.

What is claimed is:

1. A system receiving and storing data at an input clock frequency, and applying the stored data at an adjustable output clock frequency, comprising:

first and second memory means for receiving said data at said input clock, storing said data, and applying said data therefrom at said output clock;

switch means for transmitting said data at said input clock for storage in one of said first and second memory means, while transmitting stored data from the other one of said first and second memory means at said output clock;

means coupled to said first and second memory means, respectively, to indicate when a predetermined amount of said stored data has been applied therefrom, and to provide responsively a memory switching signal;

said switch means being further coupled to receive said memory switching signal and to responsively switch between said first and second memory means;

stable oscillator means providing an oscillating signal having a selected fixed frequency;

frequency divider means having an adjustable dividing ration, for receiving said oscillating signal, and for providing a frequency divided output signal, corresponding to said output clock;

means for detecting said output clock frequency with respect to a reference signal, and for providing a first control signal when said detected frequency is higher than a predetermined multiple of said reference signal frequency, and a second control signal when said detected frequency is lower; and dividing ratio adjustment means for receiving said first and second control signal and for adjusting responsively said dividing ratio of said frequency dividing means to change the frequency of said output clock to substantially correspond to said predetermined multiple of said reference signal frequency.

2. The system of claim 1 wherein said means for detecting said output clock frequency comprises and event detector means coupled to detect occurrence of a signal derived from said frequency divided output signal with respect to said reference signal, and to provide said first control signal in response to an early occurrence, and said second control signal in response to a late occurrence of said derived signal.

3. The system of claim 2 wherein said means for detecting said output clock frequency further comprises counter means coupled to receive said output clock, to count a predetermined number of consecutive cycles thereof, to obtain said signal derived from said frequency divided output signal.

4. The system of claim 2 wherein said occurrence of said signal derived from said frequency divided output signal corresponds to an occurrence of said memory switching signal.

5. A system for receiving data recovered from a magnetic recording medium by a magnetic transducer mounted on a rotating scanner drum, said system receiving said data at a first clock rate, storing said data in a memory, and outputting said stored data from said memory at a second clock rate which is substantially lower than said first clock rate, comprising:

first and second memory means coupled to receive and store said recovered data at said first clock rate;

switch means coupled to transmit said recovered data at said first clock rate to one of said first and second memory means, respectively, and to transmit a second clock signal of said second rate to the other one of said memory means, for outputting stored data therefrom, said switch means being further coupled to switch said respective signals transmitted thereby between said first and second memory means in response to a memory switching signal indicating a predetermined level of fullness of one said memory means;

means for detecting occurrence of said memory switching signal with respect to a reference signal derived from a rotation of said scanner;

oscillator means providing an oscillating output signal having a selected fixed frequency;

frequency divider means having an adjustable dividing ratio, coupled to receive said output signal provided by said oscillator means and to provide a frequency divided output signal having a nominal frequency corresponding to said second clock rate;

means responsive to said detecting means and coupled to said frequency divider means for increasing said dividing ratio thereof in response to an early occurrence of said memory switching signal, and for decreasing said dividing ratio in response to a late occurrence of said memory switching signal with respect to said reference signal; and wherein said frequency divided output signal is applied to said switch means as said second clock signal.

* * * * *